Figure 1:
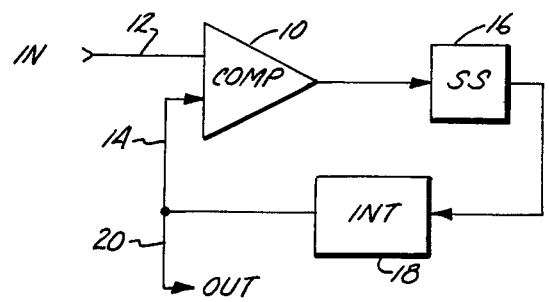

United States Patent [19]

van der Schans

[11] Patent Number: 4,560,940

[45] Date of Patent: Dec. 24, 1985

[54] PEAK AMPLITUDE MEASUREMENT

[75] Inventor: Albert van der Schans, Bloomington, Minn.

[73] Assignee: Magnetic Peripherals Inc., Minneapolis, Minn.

[21] Appl. No.: 503,118

[22] Filed: Jun. 10, 1983

[51] Int. Cl.[4] .......................................... H03K 5/153
[52] U.S. Cl. .................................. 328/150; 307/351; 307/359
[58] Field of Search ............... 307/351, 359; 328/150, 328/151; 324/103 P

[56] References Cited

U.S. PATENT DOCUMENTS 3,916,327  10/1975  Lampen et al. ..................... 328/150
3,938,188   2/1976  Fletcher et al. .................... 340/347
3,984,832  10/1976  Henry ................................ 340/347
4,204,260   5/1980  Nysen ............................... 307/359

Primary Examiner—John Zazworsky
Attorney, Agent, or Firm—Robert M. Angus; Joseph A. Genovese

[57] ABSTRACT

Apparatus for measuring the peak amplitude of an input signal includes a comparator for comparing the input signal against a reference signal. The comparator selectively drives a latch which in turn drives a successive approximation register. The count in the successive approximation register is selectively increased or decreased by a predetermined amount, depending on the condition of the latch and the count in the register. The register count is converted by a digital-to-analog converter to provide the reference signal.

3 Claims, 2 Drawing Figures

PEAK AMPLITUDE MEASUREMENT

This invention relates to peak amplitude measuring techniques, and particularly to apparatus for measuring peak signal amplitude using successive approximation techniques.

It is important to certain computer applications to know the peak amplitude of signals flowing within the computer circuitry. For example, when reading data from magnetic discs it is important to adjust the gain of signal amplifiers to adjust the peak amplitude to a desirable level for use in the data recovery circuitry; hence, peak amplitude detection becomes relevant. Prior to the present invention, signal peak amplitude was detected by a comparator comparing the input signal peak to a DC reference signal. The DC reference signal was derived by an integrator driven by a single-shot multivibrator arranged so that the comparator drove the multivibrator. If the peak amplitude of the input signal exceeded the output voltage of the integrator, the single-shot multivibrator was triggered to operate the integrator to increase its output voltage. If the peak amplitude of the input signal was less than the DC output of the integrator, the multivibrator was not triggered and the integrator discharged, typically through a resistor-capacitor time delay. The process continued until the output voltage of the integrator equaled the peak amplitude of the input signal.

The above-described peak amplitude measuring technique is not altogether adequate for computer applications. Particularly, the apparatus is relatively slow in response to changes in input signal amplitude. Furthermore, due to the response time of the integrator, the prior apparatus has a limited input frequency response. Furthermore, in most computer applications, a digital output is required to interface with the computer whereas the only output in the above-described technique is a DC voltage from the integrator. Consequently, an additional analog-to-digital converter was required to convert the output voltage of the integrator to a digital signal to interface with the computer.

It is an object of the present invention to provide a peak amplitude measuring circuit which is digital in operation to provide a digital output of the peak amplitude value of the input signal.

It is another object of the present invention to provide a digital peak amplitude measuring technique utilizing successive approximation of the peak amplitude of the input signal.

A peak amplitude measuring circuit in accordance with the present invention comprises a successive approximation register containing a digital count. A digital signal from the register is provided to a digital-to-analog converter which provides a DC signal to the input of a comparator. The input signal being compared is provided to a second input of the comparator, and the comparator provides an output to a latch or flip-flop. The latch output provides an input to the register to selectively increase or decrease the digital value stored therein.

One feature of the present invention resides in the fact that a digital signal from the register indicative of the peak amplitude of input signals is provided for direct operation within the computer.

Another feature of the present invention resides in the fact that the apparatus is capable of responding to frequencies greatly in excess of prior peak measurement apparatus.

Another feature of the present invention resides in the fact that the conversion time to determine the peak amplitude of an input signal is significantly reduced from that required by prior apparatus. Changes in input amplitude may be more quickly detected and converted.

Figure 2:
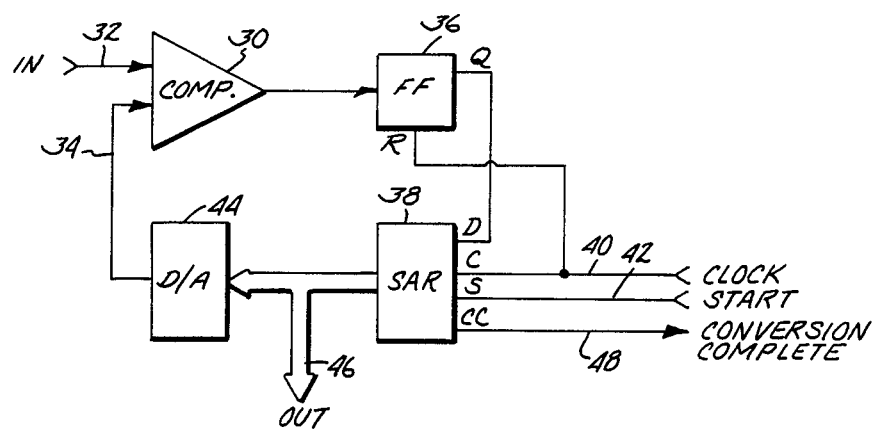

The above and other features of this invention will be more fully understood from the following detailed description and the accompanying drawings, in which:

FIG. 1 is a block circuit diagram of a peak amplitude measurement apparatus in accordance with the prior art; and FIG. 2 is a block circuit diagram of a peak amplitude measurement apparatus in accordance with the present invention.

Referring to the drawings, and particularly to FIG. 1, there is illustrated a peak amplitude measuring circuit in accordance with the prior art. The prior art circuit comprised a comparator 10 having a first input 12 for receiving an input signal and a second input 14 for receiving a DC reference signal. The output of comparator 10 was provided to single-shot multivibrator 16 which in turn provided an output to analog integrator 18. Integrator 18 provided an output reference signal to the input 14 of comparator 10, which also was provided as an analog output signal on lead 20. In operation of the peak amplitude measuring circuit of FIG. 1, if the peak amplitude of the input signal at lead 12 exceeded the reference signal from integrator 18, comparator 10 provided a signal to single-shot multivibrator 16 to trigger the multivibrator. Integrator 18 integrated the signal from multivibrator 16 to increase the reference voltage to input 14 of comparator 10. If the peak amplitude of the input signal on lead 12 was less than reference signal from integrator 18, the single-shot multivibrator was not triggered and the integrator 18 was allowed to discharge, typically through a resistive-capacitive circuit, to reduce the reference signal amplitude to input 14 of the comparator. In a typical prior art system, the RC time constant of integrator 18 was of the order of 400 microseconds. Consequently, the system illustrated in FIG. 1 was responsive to relatively low input frequencies, for example of the order of 10 MHz. Further, the 400 microsecond time constant of integrator 18 caused the apparatus to be relatively slow in response to changes in input signal amplitude. Additionally, the output on lead 20 was a DC analog output so an additional analog-to-digital converter was required to interface the output of integrator 18 with computer circuits.

FIG. 2 illustrates a peak amplitude detection apparatus in accordance with the presently preferred embodiment of the present invention. As illustrated in FIG. 2, comparator 30 has an input 32 for receiving input signals and an input 34 for receiving a DC reference signal. Comparator 30 provides an output to latch flip-flop 36, the Q output of flip-flop 36 being provided to the D input of successive approximation register (SAR) 38. A clock signal is provided via lead 40 to the clock input of register 38 as well as to the reset input of flip-flop 36. A start signal input 42 is provided to the start input of register 38. Register 38, which may be a 12-bit successive approximation register, provides a digital output to digital-to-analog converter 44 which in turn provides an analog DC output signal to input 34 of comparator 30. Also, a 12-bit digital output is provided via output 46 for direct utilization in the computer, and a conversion complete output is provided by lead 48.

In operation of the apparatus illustrated in FIG. 2, register 38 receives a start pulse via lead 42 causing the register to store a digital signal equal to the approximate half scale value of the maximum count of register 38. For a 12-bit register 38, the application of the start bit on lead 42 will set the register to a count of 011111111111 (equal to 2047 in decimal terms). Converter 44 converts the digital signal stored in register 38 to a corresponding analog voltage signal which in turn is provided to comparator 30, the analog signal from converter 44 having a voltage level representative of the digital count stored in register 38. Comparator 30 compares the input signal appearing on line 32 to the analog voltage signal from converter 44. If the peak amplitude of the input signal at input 32 is greater than the DC signal appearing at input 34, comparator 30 provides an output to flip-flop 36 causing the flip-flop to set to provide a high Q output condition to provide a high signal to the D input of register 38. If the peak amplitude of the input signal at input 32 is not greater than the amplitude of the reference signal at input 34, flip-flop 36 is not set by comparator 30 and a low signal is provided to the D input of register 38. As will be more fully understood hereinafter, flip-flop 36 is reset before each compare operation of comparator 30.

Register 38 is a standard successive approximation register commercially available from several sources. Two typical sources include Advanced Microdevices Corporation as their Model No. 2504 and National Semiconductor Corporation as their Model DM2504. In operation of a typical successive approximation register, each step of the clock cycle operates on a successively decreasing significant bits of the register to successively increase or decrease the count in the register depending upon whether the D input of the register is high or low during the rising edge of the clock pulse appearing at the clock input. With the register initially set at 011111111111, upon the presence of the next clock pulse, the register will set the eleventh bit to 0, and either set or not set the twelfth bit to 1, depending upon whether the D input is high or low. Similarly, on the next clock pulse, the register will set the tenth bit to 0 and either set or not set the eleventh bit to 1, depending upon the high or low status of the D input. Similarly, upon the next clock pulse, the ninth bit is set to 0 and the tenth bit is set or not set to 1 depending upon the high or low level of the D input. The process continues through the successive bits in descending order. After 12 cycles of the clock signal, the output of register 38 will be the digital equivalent of the peak amplitude of the input voltage at input 32 so that the voltage output from digital-to-analog converter 44 equals the peak input at input 32. Upon completion of the twelfth cycle, register 38 provides a conversion complete output on lead 48 to indicate to the computer that the digital output appearing at output 46 is the digital equivalent of the peak amplitude of the input signal.

By way of example, assume register 38 is initially set to 011111111111 (decimal 2047). Assume further that the peak amplitude of the input signal is higher than the voltage output from converter 44 as set by the count in register 38. Under these circumstances, flip-flop 36 is set by comparator 30 to provide a high D input to register 38 so that upon the next positive clock transition, register 38 is set to 101111111111 (decimal 3071). Converter 44 converts the count in register 38 to a new reference voltage which is compared against the peak amplitude of the input signal. Flip-flop 36 is reset during the positive half of each clock cycle. At the same time, the converter 44 is permitted time to settle in its DC output. While the clock signal is low and the converter 44 output is stable, flip-flop 36 is enabled to respond to a signal from comparator 30. If the peak of the input signal exceeds the reference voltage from comparator 44, the flip-flop will set and stay set until the next clock transition. If the peak of the input signal is lower than the reference voltage from comparator 44, the flip-flop will not be set. Consequently, flip-flop 36 effectively latches onto the peaks.

Assume that the peak amplitude of the input signal is still higher than the reference voltage at input 34, flip-flop 36 is again set so that upon the next clock input to register 38 the count is increased to 110111111111 (decimal 3583). Converter 44 provides a yet higher reference voltage to the input 34 of comparator 30 for comparison against the peak amplitude of the signal at input 32. Assume now that the peak amplitude of the signal at input 32 is lower than the reference voltage from converter 44. As a result, a low output is provided from comparator 30. As explained above, during the positive half of the clock cycle on lead 40, flip-flop 36 was reset. Since in the example comparator 30 provides no output to flip-flop 36, the Q output of flip-flop 36 remains low providing a low input to the D input of register 38. Consequently, upon the next positive transition of the clock signal on lead 40, register 38 is set to 110011111111 (decimal 3327). If on the next iteration the peak amplitude of the input signal at input 32 is higher than the voltage appearing at input 34, comparator 30 operates to set flip-flop 36 to provide a high D input to register 38 causing an increase of the count to 110101111111 (decimal 3455). The process continues through 12 cycles of the clock. Upon completion of the process, register 38 provides a signal output on lead 48 to indicate that the digital output at output 46 represents the peak amplitude of the input signal, and, upon the next clock pulse, register 38 is reset and the process starts again.

One feature of the present invention is the fact that the conversion time to lock into the peak amplitude of an input signal is X+1 times the clock period, where X equals the number of bits of the register 38. The limiting factors on clock frequency are the settling time of converter 44 and the minimum frequency of the input signal at which the circuit will still operate. For a typical circuit with a converter 44 settling time of less than 100 nanoseconds, a register 38 capacity of twelve bits and an input frequency of 2 MHz, the conversion time is of the order of 8 microseconds. The frequency response is greatly increased over prior techniques. For example, a −2% frequency response occurs at approximately 22 MHz, as compared to 10 MHz in prior techniques described in FIG. 1. Further, the circuit is capable of measuring signals with frequencies in excess of 100 MHz.

The output 46 of the circuit may be directly coupled to the digital circuits of a computer rather than calculated through an analog-to-digital converter as required in the prior art. As a result, modulation of the input signal may be more readily determined by the computer.

This invention is not to be limited by the embodiment shown in the drawings and described in the description, which is given by way of example and not of limitation, but only in accordance with the scope of the appended claims.

What is claimed is:

1. Apparatus for measuring the peak amplitude of an input signal, comprising, in combination: comparator means having a first input for receiving an input signal whose peak amplitude is to be measured and a second input for receiving a reference signal, said comparator means providing an output signal whenever the amplitude of said input signal exceeds the amplitude of said reference signal; latch means responsive to the output signal from said comparator means for providing a latch signal; a successive approximation register having a clock input for receiving clock signals and a drive input for receiving said latch signal, said register containing a digital count comprising a plurality of bits, said register being responsive to said clock signal and to said latch signal to operate on successively decreasing significant bits in said digital count to successively increase and decrease said digital count with each clock cycle, the increase or decrease of said digital count being based on the value of said latch signal; and converter means responsive to said digital count for providing said reference signal, said reference signal having an amplitude representative of said digital count.

2. Apparatus according to claim 1 wherein said latch means further includes a reset input for receiving said clock signals, said latch means being reset by said clock signals to produce a latch signal of a first value and being set by said output signal from said comparator means to produce a latch signal of a second value, said register being responsive to said clock signal and to said latch signal of said first value to decrease the digital count in said register and being responsive to said clock signal and to said latch signal of said second value to increase the digital count in said register.

3. Apparatus according to claim 2 further including output means connected to said register for providing a digital output signal representative of the digital count in said register.

* * * * *